US012765304B2

(12) United States Patent
Tsuruda et al.

(10) Patent No.: US 12,765,304 B2
(45) Date of Patent: Oct. 13, 2026

(54) ETCHING CONTROL DEVICE, ETCHING CONTROL METHOD, AND ETCHING CONTROL SYSTEM

(71) Applicant: Tokyo Electron Limited, Tokyo (JP)

(72) Inventors: Toyohisa Tsuruda, Koshi City (JP); Hiroshi Marumoto, Koshi City (JP); Suguen Lee, Koshi City (JP); Masashi Enomoto, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 386 days.

(21) Appl. No.: 18/469,673

(22) Filed: Sep. 19, 2023

(65) Prior Publication Data

US 2024/0096658 A1 Mar. 21, 2024

(30) Foreign Application Priority Data

Sep. 20, 2022 (JP) ................................ 2022-148754

(51) Int. Cl.
*H01L 21/67* (2006.01)
*G06N 20/00* (2019.01)
*H10P 72/00* (2026.01)

(52) U.S. Cl.
CPC ......... *H10P 72/0424* (2026.01); *G06N 20/00* (2019.01); *H10P 72/0414* (2026.01); *H10P 72/0604* (2026.01)

(58) Field of Classification Search
None
See application file for complete search history.

(56) References Cited

U.S. PATENT DOCUMENTS 5,399,229 A * 3/1995 Stefani .................... H01L 22/00 257/E21.528
2012/0029856 A1* 2/2012 Cohen .............. G05B 19/41875 702/85
2013/0118533 A1* 5/2013 Takiguchi ........... H01L 21/6715 134/94.1
2017/0084473 A1* 3/2017 Zach ................. H01J 37/32935
2021/0202258 A1* 7/2021 Naohara ........... H01L 21/67253
2024/0096658 A1* 3/2024 Tsuruda ............ H01L 21/67253

FOREIGN PATENT DOCUMENTS

JP 2012-028571 A 2/2012
JP 2020-038888 A 3/2020

* cited by examiner

*Primary Examiner* — Sylvia Macarthur
(74) *Attorney, Agent, or Firm* — Chrisman Gallo Tochtrop LLC

(57) ABSTRACT

An etching control device includes an updating unit configured to update, to optimize a model indicating a relationship between distribution of an etching amount within a surface of a substrate and a process parameter, which is a parameter of controlling operations of multiple nozzles configured to etch the substrate, a parameter of the model; a calculator configured to calculate the process parameter corresponding to distribution of a designated etching amount by using the model whose parameter has been updated by the updating unit; and an operation controller configured to control the operations of the multiple nozzles by using the process parameter.

4 Claims, 8 Drawing Sheets

ETCHING CONTROL DEVICE, ETCHING CONTROL METHOD, AND ETCHING CONTROL SYSTEM

CROSS-REFERENCE TO RELATED APPLICATION

This application claims the benefit of Japanese Patent Application No. 2022-148754 filed on Sep. 20, 2022, the entire disclosure of which is incorporated herein by reference.

TECHNICAL FIELD

The various aspects and embodiments described herein pertain generally to an etching control device, an etching control method, and an etching control system.

BACKGROUND

Conventionally, in a semiconductor processing, a single-wafer cleaning apparatus and a developing apparatus configured to discharge a chemical liquid such as a developing liquid onto a substrate being rotated are known (see Patent Document 1, for example).

Patent Document 1: Japanese Patent Laid-open Publication No. 2012-028571

SUMMARY

In one exemplary embodiment, an etching control device includes an updating unit configured to update, to optimize a model indicating a relationship between distribution of an etching amount within a surface of a substrate and a process parameter, which is a parameter of controlling operations of multiple nozzles configured to etch the substrate, a parameter of the model; a calculator configured to calculate the process parameter corresponding to distribution of a designated etching amount by using the model whose parameter has been updated by the updating unit; and an operation controller configured to control the operations of the multiple nozzles by using the process parameter.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
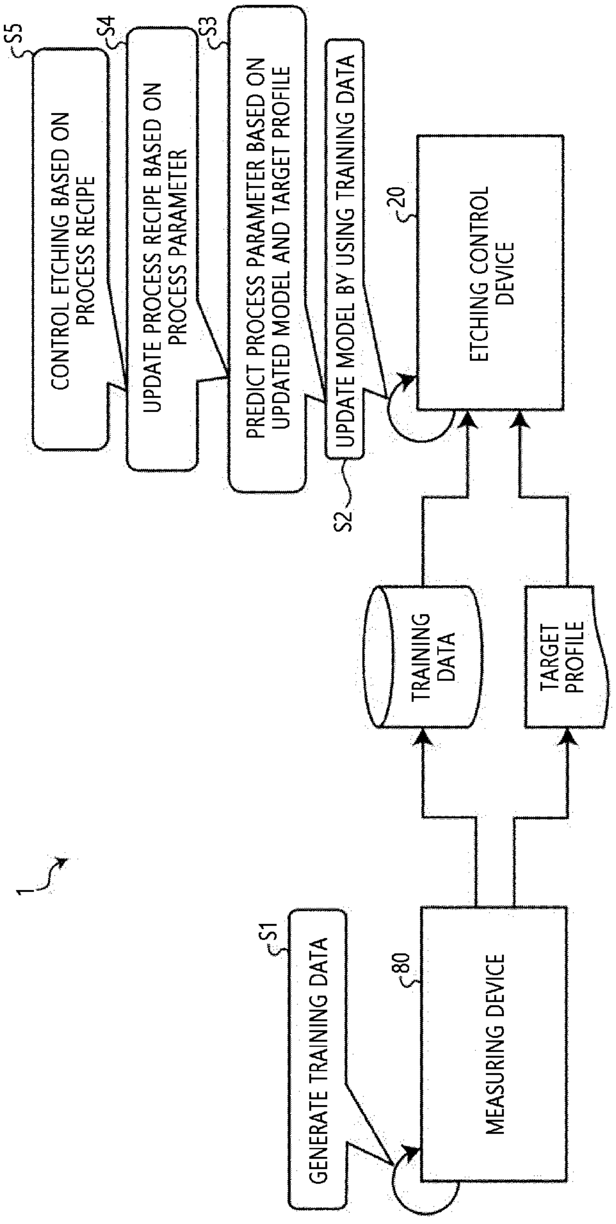
FIG. 1 is a diagram illustrating a configuration example of an etching control system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In recent years, as a semiconductor processing becomes more and more complex, the performance required for a wet etching control in a single-wafer cleaning apparatus has been diversified. For example, in some cases, not only a uniform etching profile required so far but also controllability for correcting and eliminating a residual film amount generated up to previous processes to achieve uniformity may be required.

Further, as a method of controlling a wet etching profile, a swing sequence is known. The swing sequence is a method of reciprocating a nozzle, which is configured to discharge a chemical liquid, in a radial direction of a substrate being rotated.

Conventionally, however, it has been difficult to efficiently achieve a complex distribution of an etching amount in the wet etching.

Here, the etching amount indicates a depth of etching. Further, the distribution of the etching amount (etching amount distribution) indicates an etching amount at each position (radial position) in the radial direction of the substrate.

For example, in the conventional swing sequence, since the nozzle continues to move during the rotation of the substrate (wafer), operations described in a process recipe become complicated, so it is difficult to meet the need to increase or decrease the etching amount at a certain radial position.

The process recipe is information in which an operation of one or more nozzles in the swing sequence is defined.

For example, in the conventional swing sequence, since a method for optimization of the process recipe is not automated, the optimization of the process recipe is performed by an experience of an engineer through many trials.

In this regard, there is a demand for a technique capable of efficiently achieving the complex etching amount distribution in the wet etching.

Hereinafter, an exemplary embodiment of an etching control device, an etching control method and an etching control system will be described in detail with reference to the accompanying drawings. Here, it should be noted that the present disclosure is not limited by the following exemplary embodiment.

In the exemplary embodiment, it is assumed that a wet etching called a dual dispensing process is performed. In the dual dispensing process, two nozzles discharge a liquid onto a substrate having a circular shape.

Of the two nozzles, a first nozzle discharges a rinse (for example, water), and a second nozzle discharges a chemical liquid (for example, an etching liquid). The chemical liquid corrodes the substrate. The rinse dilutes the chemical liquid to suppress the degree of corrosion of the substrate.

One of the two nozzles discharges the liquid to a central portion of the substrate, whereas the other discharges the liquid to a peripheral portion of the substrate. The etching control system creates an intended etching amount distribution on the substrate by moving the positions of two nozzles according to the process recipe.

In the dual dispensing process, controllability can be improved by moving the position of one of the two nozzles on the peripheral portion of the substrate while fixing the position of the other nozzle at the central portion of the substrate. This dual dispensing process may be employed in development, single-wafer cleaning, and so forth.

[Configuration According to Exemplary Embodiment]

Referring to FIG. 1, a configuration of the etching control system will be described. FIG. 1 is a diagram illustrating a configuration example of the etching control system.

As shown in FIG. 1, an etching control system 1 has an etching control device 20 and a measuring device 80.

The etching control device 20 performs update of a model representing a relationship between the etching amount distribution and process parameters, and prediction of the process parameters using the model. Further, the etching amount may be replaced by a CD (Critical Dimension) or an etching amount on a device pattern as well as a reducing amount in a film thickness on a single-layered wafer.

The process parameters are information of defining operations of the two nozzles in the dual dispensing process. For example, the process recipe is created based on the process parameters.

Figure 2:
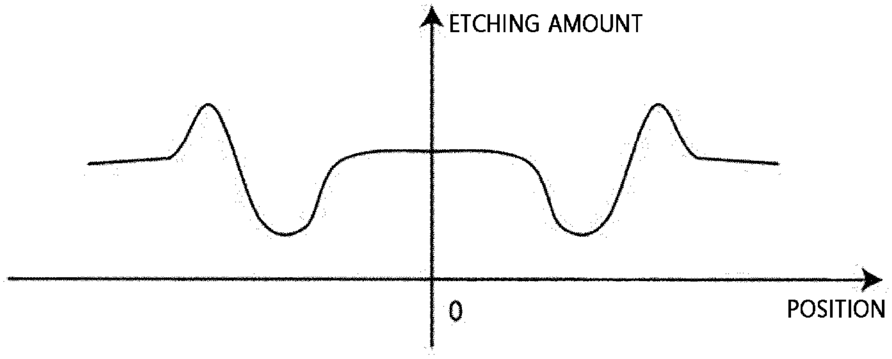
FIG. 2 is a diagram for describing an etching amount distribution.

As shown in FIG. 2, the etching amount distribution represents an etching amount at each position on the substrate. FIG. 2 is a diagram for explaining the etching amount distribution. A horizontal axis of FIG. 2 represents a distance from a center of the substrate, that is, a radial position. A vertical axis of FIG. 2 indicates the etching amount at each radial position.

The etching amount distribution may be data actually indicating etching amounts at individual radial positions at a regular interval (for example, 1 mm), or may be a parameter for specifying a shape of a curve.

The model is not particularly limited as long as it can express the relationship between the etching amount distribution and the process parameters. By way of example, the model may be a regression model. However, without being limited thereto, the model may be a neural network or the like.

The etching control device 20 controls an etching apparatus based on the process parameters. Specifically, the etching control device 20 controls the operations of the two nozzles in the dual dispensing process.

The measuring device 80 measures distribution of a residual film amount (residual film amount distribution) of the substrate as a target of etching. For example, the measuring device 80 measures the residual film amount distribution of the substrate by a spectroscopic film thickness gauge, a scatterometer, a SEM (Scanning Electron Microscope), or the like.

Figure 3:
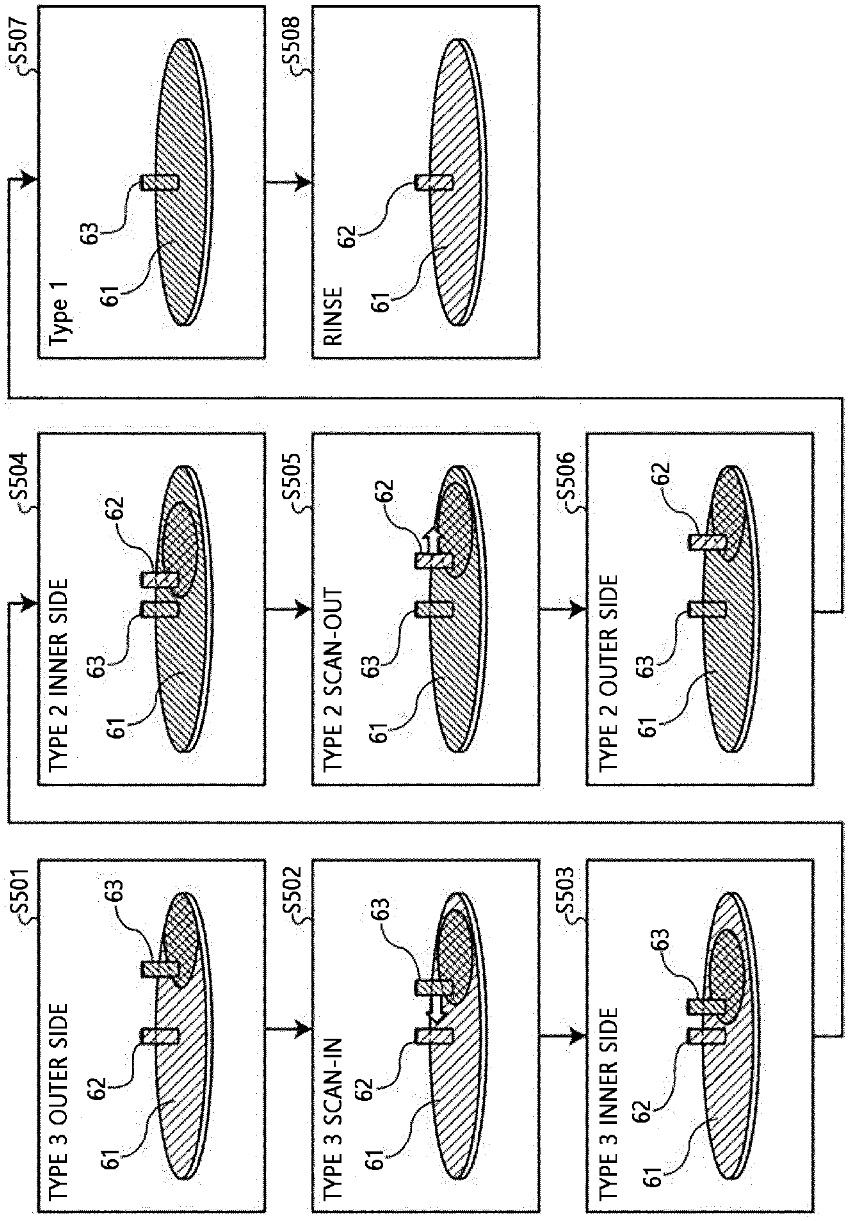
FIG. 3 is a diagram for describing a dual dispensing process.

Here, the dual dispensing process will be described with reference to FIG. 3. FIG. 3 is a diagram for explaining the dual dispensing process.

As depicted in FIG. 3, the dual dispensing process in the present exemplary embodiment includes processes S501, S502, S503, S504, S505, S506, S507, and S508. In the dual dispensing process, all of these processes may be performed, or some of them may be omitted. The process parameters define the operations (discharge positions, discharge times, speeds, etc.) of the nozzles in each process.

A wafer 61 is a circular (disc-shaped) substrate on which the etching is performed in the dual dispensing process. A nozzle 62 is a nozzle configured to discharge the rinse (for example, water). A nozzle 63 is a nozzle configured to discharge the chemical liquid (for example, the etching liquid).

In a process S501 (Type 3 outer side), the nozzle 62 discharges the rinse to a central portion of the wafer 61, and the nozzle 63 discharges the chemical liquid to a peripheral portion of the wafer 61. Further, for this process S501, the discharge position and the discharge time of the nozzle 63 are defined by the process parameters.

In a process S502 (Type 3 scan-in), the nozzle 62 discharges the rinse to the central portion of the wafer 61, and the nozzle 63 discharges the chemical liquid while moving from the peripheral portion of the wafer 61 to the central portion thereof. For this process S502, a moving speed of the nozzle 63 is defined by the process parameter.

In a process S503 (Type 3 inner side), the nozzle 62 discharges the rinse to the central portion of the wafer 61, and the nozzle 63 discharges the chemical liquid to the peripheral portion (however, closer to the central portion than in the process S501 (Type 3 outer side)) of the wafer 61. For this process S503, the discharge position and the discharge time of the nozzle 63 are defined by the process parameter.

In a process S504 (Type 2 inner side), the nozzle 63 discharges the chemical liquid to the central portion of the wafer 61, and the nozzle 62 discharges the rinse to the peripheral portion of the wafer 61. Further, for this process S504, the discharge position and the discharge time of the nozzle 62 are defined by the process parameters.

In a process S505 (Type 2 scan-out), the nozzle 63 discharges the chemical liquid to the central portion of the wafer 61, and the nozzle 62 discharges the rinse while moving from the central portion of the wafer 61 to the peripheral portion thereof. For this process S505, the moving speed of the nozzle 62 is defined by the process parameters.

In a process S506 (Type 2 outer side), the nozzle 63 discharges the chemical liquid to the central portion of the wafer 61, and the nozzle 62 discharges the rinse to the peripheral portion (however, farther from the central portion than in the process S504 (Type 2 inner side)) of the wafer 61. For this process S506, the discharge position and the discharge time of the nozzle 62 are defined by the process parameters.

In a process S507 (Type 1), the nozzle 63 discharges the chemical liquid to the central portion of the wafer 61. For this process S507, the discharge time of the nozzle 63 is defined by the process parameters.

In a process S508 (Type 1), the nozzle 62 discharges the rinse to the central portion of the wafer 61.

In a recipe of Type 3, the etching amount on the region of the wafer 61 to which the chemical liquid is discharged by the nozzle 63 increases. Specifically, with an increase of the discharge time of the nozzle 63 (or with a decrease of the moving speed of the nozzle 63 in scanning), the etching amount increases as compared to those in other regions. In a recipe of Type 2, the etching amount on the region to which the rinse is discharged by the nozzle 62 decreases. With an increase of the discharge time of the nozzle 62 (or with a decrease of the moving speed of the nozzle 62 in scanning), the etching amount decreases as compared to those in the other regions.

In addition, a moving start position and a moving end position in the scanning (processes S502 and S505) are derived from the discharge positions in the previous and subsequent stages. Further, the discharge time is derived from the moving speed, the moving start position and the moving end position. For this reason, for the scanning, only the moving speed needs to be defined by the process parameters.

By adjusting the process parameters for each process described in FIG. 3, the etching control device 20 is capable of realizing various etching amount profiles.

Referring back to FIG. 1, a flow of a processing of the etching control system 1 will be explained. First, the measuring device 80 generates training data (process S1). An etching amount of the training data corresponds to a difference in a residual film amount measured by the measuring device 80 before and after the etching processing, that is, an etching amount distribution.

Subsequently, the etching control device 20 updates the model by using the training data (process S2).

The training data is a combination of a profile (calibration curve data) of the etching amount, which is a difference in the residual film amount obtained by actually measuring the substrate by the measuring device 80 before and after the etching, and the process parameters at that time. This combination of the data can be said to be teaching data in machine learning. The etching control device 20 is capable of updating the model by a known learning method.

Then, the etching control device 20 predicts the process parameters based on the updated model and a target profile (process S3). The target profile is a designated etching amount distribution. The process parameters corresponding to the target profile are unknown.

For example, the target profile may be an etching amount distribution capable of removing a residual film on the substrate generated in previous processes.

The etching control device 20 inputs the target profile into the updated model, and outputs the process parameters. That is, in the process S3, an inference processing using the updated model is performed.

Subsequently, the etching control device 20 updates the process recipe based on the process parameters (process S4). Then, the etching control device 20 performs etching based on the process recipe (process S5).

Figure 4:
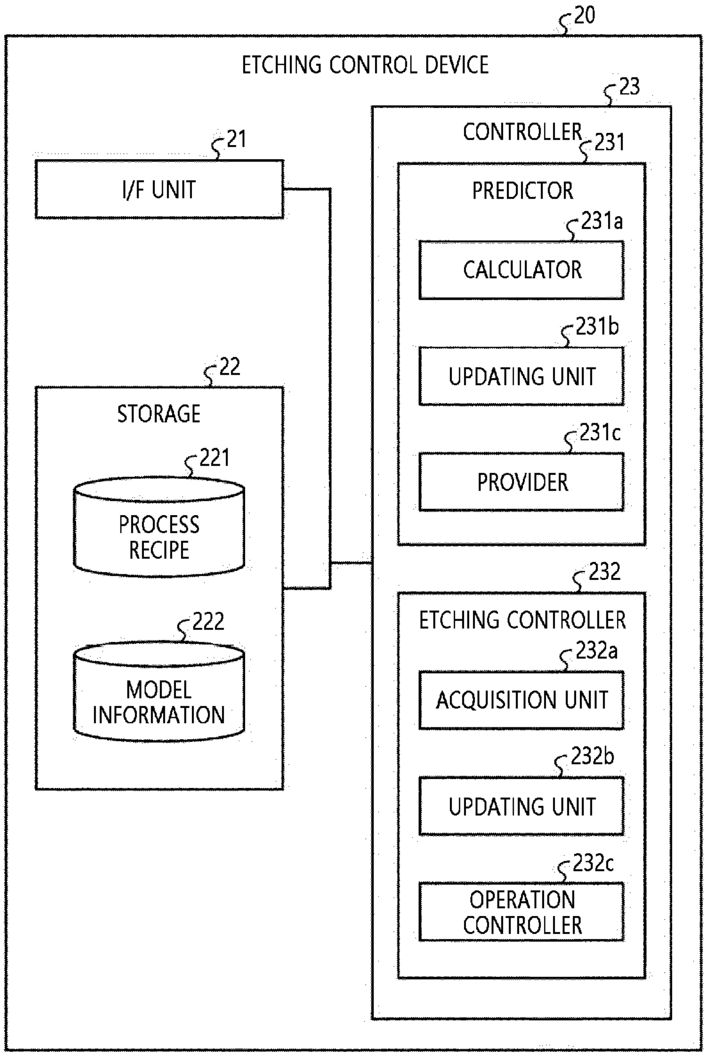
FIG. 4 is a diagram illustrating a configuration example of an etching control device.

A configuration of the etching control device 20 will be described with reference to FIG. 4. FIG. 4 is a block diagram showing a configuration example of the etching control device according to the exemplary embodiment.

As shown in FIG. 4, the etching control device 20 includes an I/F (interface) unit 21, a storage 22, and a controller 23.

The I/F unit 21 is an interface configured to exchange data with other devices. For example, the I/F unit 21 is a NIC (Network Interface Card). Further, the I/F unit 21 may be connected to input/output devices such as a mouse, a keyboard, a display, a speaker, and the like.

The storage 22 is implemented by, for example, a semiconductor memory device such as a RAM (Random Access Memory) or a flash memory, or a storage device such as a hard disk or an optical disk.

The storage 22 stores therein a process recipe 221 and model information 222. The process recipe 221 is information in which operations of the respective nozzles in the dual dispensing process are defined. The model information 222 is information for constructing the model. The model information 222 is updated by the etching control device 20. For example, the model information 222 is a parameter such as a regression coefficient in a regression model.

Further, the controller 23 may be implemented as a program stored in an internal storage device is executed by, for example, a CPU (Central Processing Unit), a MPU (Micro Processing Unit), a GPU (Graphics Processing Unit), or the like by using a RAM as a work area.

Further, the controller 23 may be implemented by an integrated circuit such as, but not limited to, an ASIC (Application Specific Integrated Circuit) or a FPGA (Field Programmable Gate Array).

The controller 23 includes a predictor 231 and an etching controller 232. Further, the predictor 231 includes a calculator 231*a*, an updating unit 231*b*, and a provider 231*c*. The etching controller 232 includes an acquisition unit 232*a*, an updating unit 232*b*, and an operation controller 232*c*. Further, the internal configuration of the controller 23 is not limited to the example described herein, and various other configurations may be adopted as long as an information processing to be described later can be carried out.

The calculator 231*a* is configured to input the etching amount distribution into the model constructed on the basis of the model information 222, and calculate the process parameters. The calculator 231*a* may input the etching amount distribution included in the training data or the etching amount distribution designated as the target profile into the model.

The updating unit 231*b* is configured to update parameters of the model indicating a relationship between the etching amount distribution within the surface of the substrate and process parameters, which are parameters of controlling the operations of the plurality of nozzles to perform the etching on the substrate, to thereby optimize the model.

Here, the updating unit 231*b* updates the parameters (model information 222) of the model such that a difference between the etching amount distribution included in the training data and the etching amount data predicted from the process parameters at the time of acquiring the training data becomes small.

For example, if the model is a regression model, the updating unit 231*b* may update the parameters by using a least squares method, and if the model is a neural network, the updating unit 132 may update the parameters by using an error back-propagation method.

The provider 231*c* provides the process parameters calculated by the calculator 231*a*. The provider 231*c* may output the process parameters to an output device such as a display or a printer, or may transmit the process parameters to the etching controller 232.

The acquisition unit 232*a* acquires the process parameters provided from the provider 231*c*.

The updating unit 232*b* is configured to update the process recipe 221 based on the process parameters acquired by the acquisition unit 232*a*.

The operation controller 232*c* is configured to control the operations of the nozzles by using the process parameters acquired by the acquisition unit 232*a*. The operation controller 232*c* operates the nozzles according to the process recipe 221 to thereby perform the dual dispensing process.

[Processing According to Exemplary Embodiment]

Figure 5:
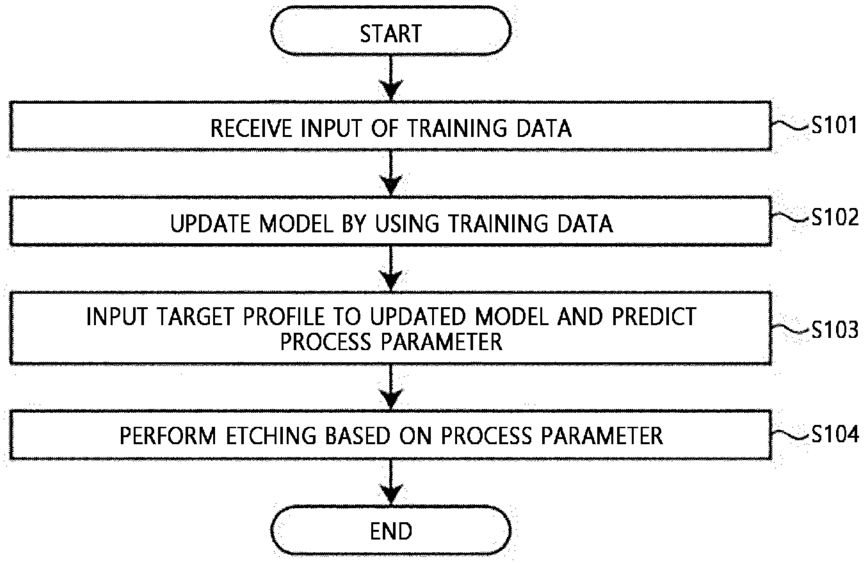
FIG. 5 is a flowchart illustrating a flow of a processing performed by the etching control system.

Referring to FIG. 5, a flow of a processing performed by the etching control system 1 will be explained. FIG. 5 is a flowchart showing the flow of the processing of the etching control system.

First, the etching control device 20 receives the training data inputted thereto (process S101). Then, the etching control device 20 updates the model by using the training data (process S102).

Next, the etching control device 20 inputs the target profile to the updated model and predicts the process parameters (process S103). The etching control device 20 performs the etching based on the process parameters (process S104).

Figure 6:
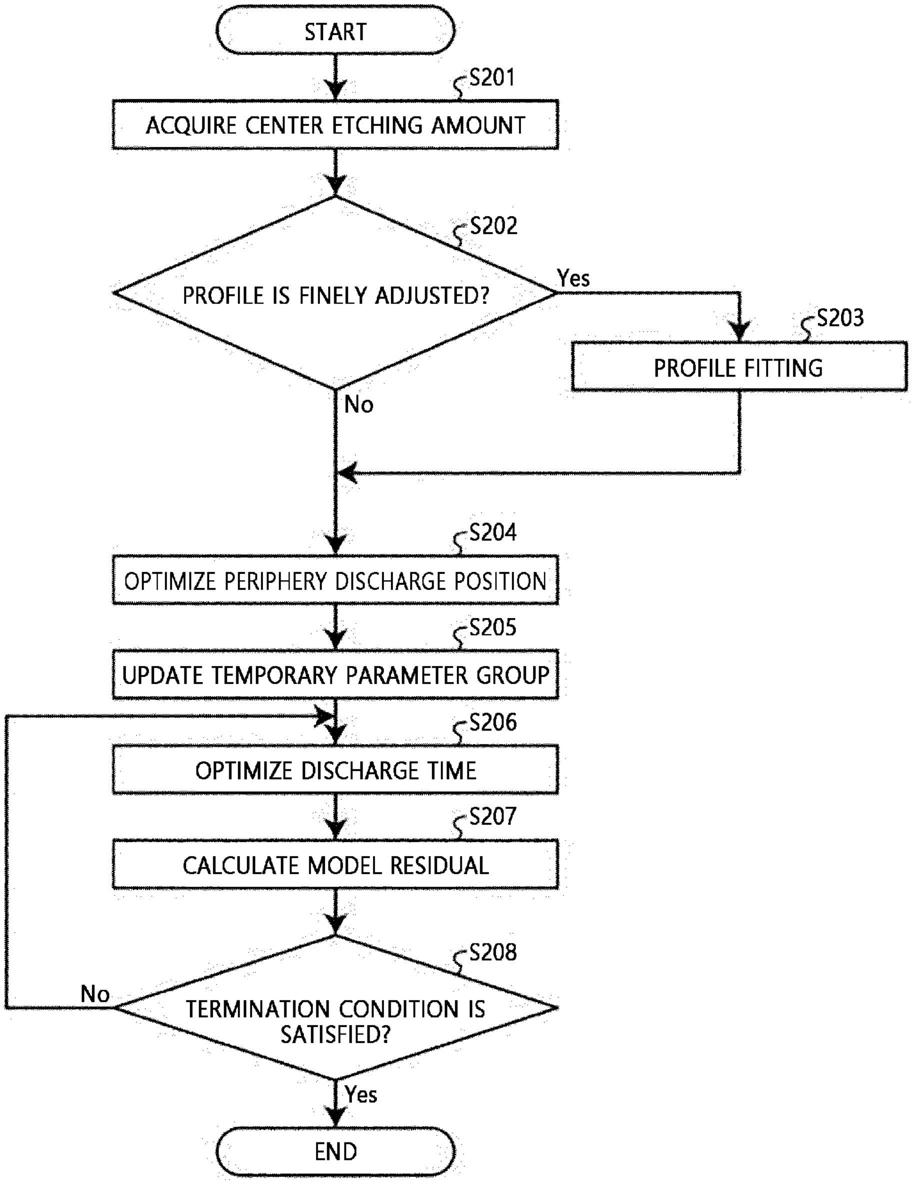
FIG. 6 is a flowchart illustrating a flow of a model updating process and a process parameter predicting process.
Figure 7:
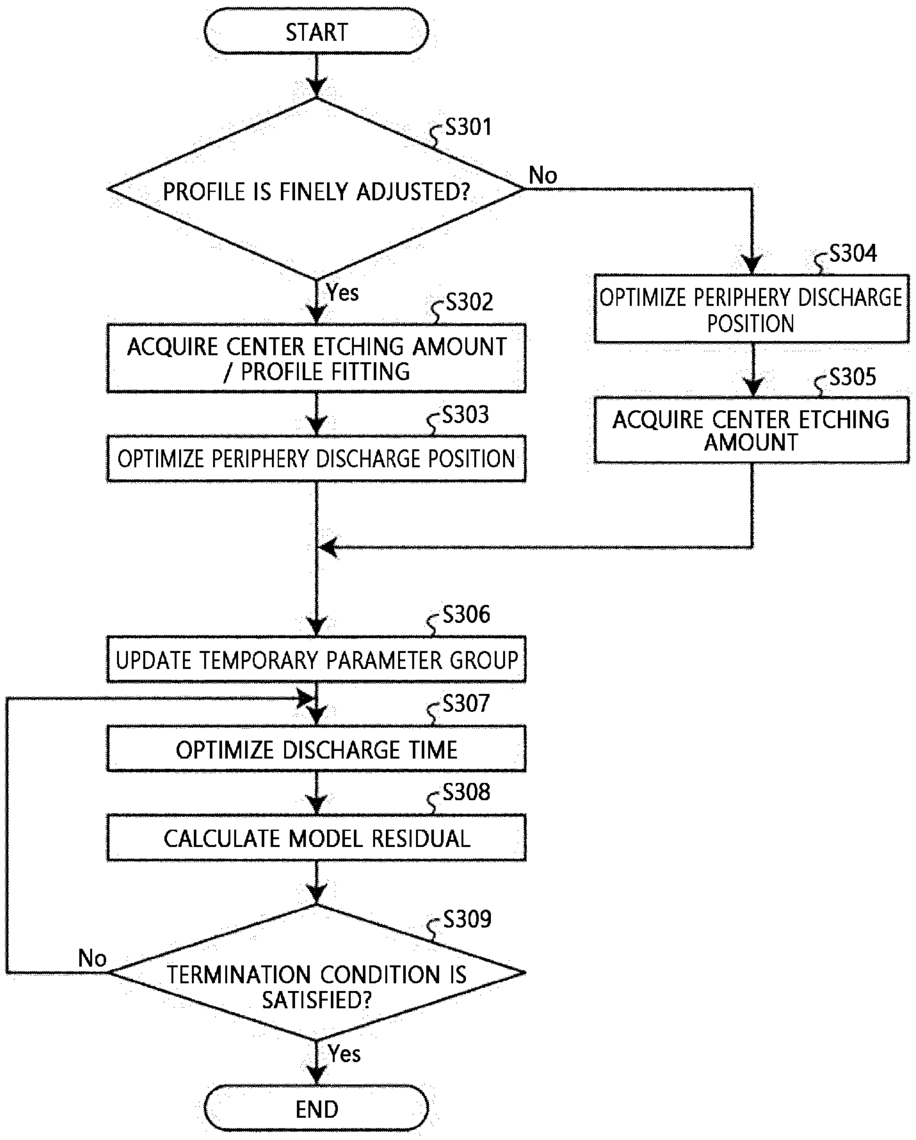
FIG. 7 is a flowchart illustrating a flow of the model updating process and the process parameter predicting process.

Here, flows of the model updating process and the process parameter predicting process by the etching control device 20 will be described with reference to FIG. 6 and FIG. 7. FIG. 6 and FIG. 7 are flowcharts showing the flows of the model updating process and the process parameter predicting process.

It is assumed that eleven process parameters as follows are outputted by the model. Through these, the model indicates the relationship between the etching amount distribution and the process parameters, which are parameters of determining the discharge times, the discharge positions, and the moving speeds of the first nozzle configured to discharge the rinse onto the substrate being rotated and the second nozzle configured to discharge the chemical liquid for etching the substrate.

(1) Center discharge (Type 1) time: related to the discharge time of the nozzle 63 in the process S507 (Type 1)

(2) Type 2 periphery discharge position_1: related to the discharge position of the nozzle 62 in the process S504 (Type 2 inner side)

(3) Type 2 periphery discharge time_1: related to the discharge times of both nozzles in the process S504 (Type 2 inner side)

(4) Type 2 scan speed: related to the moving speed of the nozzle 62 in the process S505 (Type 2 scan-out)

(5) Type 2 periphery discharge position_2: related to the discharge position of the nozzle 62 in the process S506 (Type 2 outer side)

(6) Type 2 periphery discharge time_2: related to the discharge times of both nozzles in the process S506 (Type 2 outer side).

(7) Type 3 periphery discharge position_1: related to the discharge position of the nozzle 63 in the process S501 (Type 3 outer side).

(8) Type 3 periphery discharge time_1: related to the discharge times of both nozzles in the process S501 (Type 3 outer side).

(9) Type 3 scan speed: related to the moving speed of the nozzle 63 in the process S502 (Type 3 scan-in).

(10) Type 3 periphery discharge position_2: related to the discharge position of the nozzle 63 in the process S503 (Type 3 inner side).

(11) Type 3 periphery discharge time_2: related to the discharge times of both nozzles in the process S503 (Type 3 inner side).

Although names such as discharge position, discharge time, and speed are assigned to the process parameters, the values of these process parameters do not necessarily directly determine the discharge positions, the discharge times, and the speeds of the nozzles.

By way of example, although the process parameter '(2) Type 2 periphery discharge position_1' is related to the discharge position of the nozzle 62 in the process S506 (Type 2 outer side) of FIG. 3, it may not be regarded as uniquely restricting the discharge position of the nozzle 62.

For example, the etching control device 20 appropriately processes the value of each process parameter, sets the unit, and generates the process recipe. In this case, the etching control device 20 controls the operations of the nozzles according to the process recipe.

FIG. 6 is a flowchart showing the flow of the model updating process. First, the etching control device 20 acquires a center etching amount as the training data (process S201). Specifically, the etching control device 20 acquires a combination of the etching amount of the central portion and the process parameter (actual value) (1).

Here, by referring to various etching profiles prepared in advance, the etching control device 20 can update the model by using only the etching amount of the central portion and the process parameter (1). When the model is updated by using the previously prepared etching profile, that is, when the profile is not finely adjusted (process 202, No), the etching control device 20 proceeds to a process S204.

Meanwhile, when the model is not updated by using the previously prepared etching profile, that is, when the profile is finely adjusted (process 202, Yes), the etching control device 20 proceeds to a process S203.

In a profile fitting (process S203), the etching control device 20 updates the model by combining the process parameters (actual values) (2), (5), (7), and (10) with the etching amount.

Further, the etching control device 20 performs optimization of the periphery discharge positions (process S204). Here, the etching control device 20 calculates the process parameters (predicted values) (1) to (11) from the target profile by using the current model.

Then, the etching control device 20 updates a temporary parameter group such that an error between the predicted values calculated in the process S204 and the process parameters included in the training data becomes small (process S205). The temporary parameter group is one determined by the target profile and the process parameters (1) to (11), and is used in processes S206 and S207.

The etching control device 20 performs optimization of the discharge times (process S206). Here, the etching control device 20 adjusts the process parameters (2), (4), (5), (7), (9) and (10).

Further, the etching control device 20 calculates, as a model residual, an error between the target profile and the etching amount distribution derived from the process parameters predicted in the processing up to the process S206 (process S207).

At this time, if a termination condition is satisfied (process S208, Yes), the etching control device 20 outputs the process parameters predicted in the processing up to the process S206 as final process parameters, and ends the processing. For example, the termination condition may include that the model residual has become sufficiently small, repetition is performed a preset number of times, or the like.

If the termination condition is not satisfied (process S208, No), the etching control device 20 returns to the process S206 and further repeats the processing.

In the processes S201, S203 and S204, the process parameters related to the discharge positions are mainly adjusted, so that a profile of the etching amount distribution is determined. Further, in the process S206, the process parameters related to the discharge times are mainly adjusted, so that the profile of the etching amount distribution expands and contracts to approach the target profile.

The prediction device 10 may perform the model updating process according to a flow shown in FIG. 7. FIG. 7 is a flowchart showing the flow of the model updating process. In the example of FIG. 7, the process branches depending on whether fine adjustment of profile is to be performed in the initial stage.

When the model is updated by using the etching profile prepared in advance, that is, when profile is not finely adjusted (process S301, No), the prediction device 10 proceeds to a process S304.

In optimization of the periphery discharge positions in the process S304, the prediction device 10 calculates the process parameters (predicted values) (1) to (11) from the target profile by using the model. Also, the prediction device 10 acquires a center etching amount (process S305).

Meanwhile, when the model is not updated by using the previously prepared etching profile, that is, when profile is finely adjusted (process S301, Yes), the prediction device 10 proceeds to a process S302.

Then, the prediction device 10 performs the acquisition of the center etching amount and profile fitting (process S302), the same as in the processes S201 and S203 in FIG. 6, and proceeds to a process S303.

Then, in the optimization of the periphery discharge positions in the process S303, the prediction device 10 calculates the process parameters (predicted values) (2) to (11) from the target profile by using the model. Here, the predictive device 10 is already finished with the acquisition of the process parameter (1) in the process S302.

Then, the prediction device 10 updates a temporary parameter group such that an error between the predicted values calculated in the process S304 or S305 and the process parameters included in the training data becomes small (process S306). The temporary parameter group is one determined by the target profile and the process parameters (1) to (11), and is used in processes S307 and S308.

The prediction device 10 performs optimization of the discharge times (process S307). Here, the prediction device 10 adjusts the process parameters (2), (4), (5), (7), (9) and (10).

Further, the prediction device 10 calculates, as a model residual, an error between the target profile and an etching amount distribution derived from the process parameters predicted in the processing up to the process S307 (process S308).

At this time, if a termination condition is satisfied (process S309, Yes), the prediction device 10 outputs the process parameters predicted in the processing up to the process S307 as final process parameters, and ends the processing. For example, the termination condition includes that the model residual has become sufficiently small, repetition has been performed a preset number of times, or the like.

If the termination condition is not satisfied (process S309, No), the prediction device 10 returns to the process S307 and further repeats the processing.

In the processes S301, S302, S303, S304 and S305, the process parameters related to the discharge positions are mainly adjusted, so that a profile of the etching amount distribution is determined. Further, in the process S307, the process parameters related to the discharge times are mainly adjusted, so that the profile of the etching amount distribution expands and contracts to approach the target profile.

As described so far, the etching control device 20 according to the exemplary embodiment includes the updating unit 231*b*, the calculator 231*a*, and the operation controller 232*c*. The updating unit 231*b* updates, to optimize the model indicating the relationship between the etching amount distribution within the surface of the substrate and the process parameters, which are the parameters for controlling the operations of the plurality of nozzles for etching the substrate, the parameters of the model. The calculator 231*a* calculates the process parameters corresponding to the designated etching amount distribution by using the model whose parameters have been updated by the updating unit 231*b*. The operation controller 232*c* controls the operations of the plurality of nozzles by usings the process parameters acquired by the acquisition unit 232*a*. As a result, according to the exemplary embodiment, a complex etching amount distribution can be efficiently realized in wet etching.

In addition, since the etching control device 20 performs both the control of the etching operations and the optimization of the process parameters, the process parameters can be optimized on the spot by feedback based on an etching result.

Furthermore, since the etching control system 1 has the measuring device 80, it is possible to optimize the process parameters for the wafer by feedforward from the targe profile and the residual film amount of the wafer that is measured before the etching is performed.

Here, it should be noted that the above-described exemplary embodiments are illustrative in all aspects and are not anyway limiting. The above-described exemplary embodiments may be omitted, replaced and modified in various ways without departing from the scope and the spirit of claims.

Figure 8:
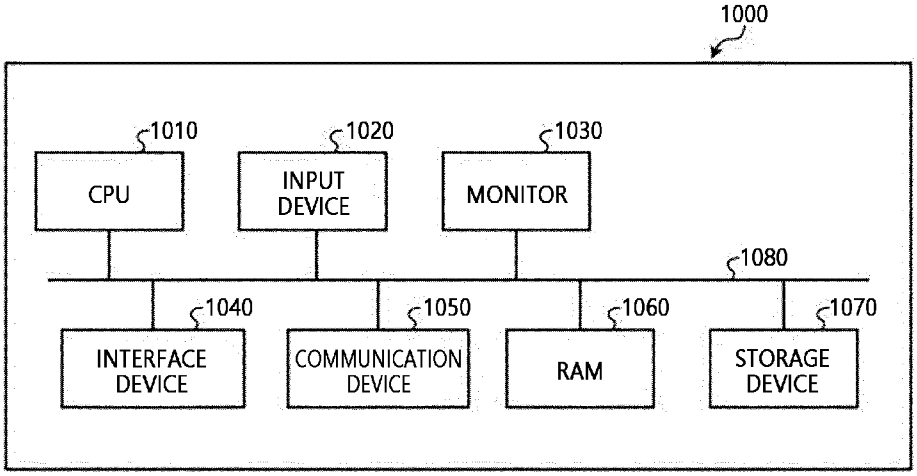
FIG. 8 is a diagram illustrating an example of a computer that executes a program.

The various processes described in the above exemplary embodiments can be realized by executing a program prepared in advance on a computer. In the following, an example of such a computer that executes programs having the same functions as the above-described embodiments will be described. FIG. 8 is a diagram showing an example of the computer that executes the programs.

As depicted in FIG. 8, a computer 1000 has a CPU 1010 configured to perform various operation processes, an input device 1020 configured to receive data inputted thereto, and a monitor 1030. Further, the computer 1000 has an interface device 1040 for connection to various devices, and a communication device 1050 for a wired or wireless connection to other information processing devices and the like. In addition, the computer 1000 has a RAM 1060 configured to temporarily store various types of information therein, and a storage device 1070. Each of the devices 1010 to 1070 is connected to a bus 1080.

The storage device 1070 stores therein programs having the same functions as those of the respective processing units of the calculator 231*a*, the updating unit 231*b*, the provider 231*c*, the acquisition unit 232*a*, the updating unit 232*b*, and the operation controller 232*c* shown in FIG. 4. Further, the model information 222 is stored in the storage device 1070. For example, the input device 1020 receives input of various types of information, such as manipulation information, from a user of the computer 1000. For example, the monitor 1030 displays various screens, such as a display screen, to the user of the computer 1000. The interface device 1040 is connected to, for example, a printing device or the like. The communication device 1050 is connected to, for example, a non-illustrated network to exchange various types of information with other information processing devices.

The CPU 1010 reads out each program stored in the storage device 1070 and deploy it to the RAM 1060 and executes it, thus allowing various processes to be performed. In addition, these programs may cause the computer 1000 to function as the calculator 231*a*, the updating unit 231*b*, the provider 231*c*, the acquisition unit 232*a*, the updating unit 232*b*, and the operation controller 232*c* shown in FIG. 4.

Furthermore, the programs do not necessarily have to be stored in the storage device 1070. For example, a program stored in a recording medium readable by the computer 1000 may be read and executed by the computer 1000. The recording medium readable by the computer 1000 includes, by way of non-limiting example, a portable recording medium such as a CD-ROM, a DVD (Digital Versatile Disc), a USB (Universal Serial Bus) memory, or the like; a semiconductor memory such as a flash memory; a hard disk drive; and the like. Alternatively, this program may be stored in a device connected to a public line, the Internet, a LAN, or the like, and the computer 1000 may read the program therefrom and execute it.

Here, the example of the computer for implementing the etching control device 20 has been described. However, the measuring device 80 may also be implemented by a computer having the same configuration as the computer described herein.

According to the exemplary embodiment, it is possible to efficiently realize the complex etching amount distribution in the wet etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An etching control device, comprising:

a parameter updating unit configured to update, to optimize a model indicating a relationship between distribution of an etching amount within a surface of a substrate and a process parameter, which is a parameter of controlling operations of multiple nozzles configured to etch the substrate, a parameter of the model;

a calculator configured to calculate the process parameter corresponding to distribution of a designated etching amount by using the model whose parameter has been updated by the parameter updating unit; and an operation controller configured to control the operations of the multiple nozzles by using the process parameter;

a recipe updating unit configured to update a process recipe defining operations of the multiple nozzles based on the process parameter calculated by the calculator;

wherein the multiple nozzles include a first nozzle configured to discharge a rinse on the substrate being rotated, and a second nozzle configured to discharge a chemical liquid to etch the substrate being rotated, and where the operation controller is further configured to simultaneously control the discharge of the rinse from the first nozzle and the discharge of the chemical liquid from the second nozzle during an etching process, wherein the operation controller is further configured to control the operation of the multiple nozzles according to the process recipe updated based on the process parameter, wherein the model is a neural network, and the parameter updating unit is further configured to update parameters of the neural network by using an error back-propagation method based on training data including an etching amount distribution and corresponding process parameters.

2. The etching control device of claim 1, wherein the parameter updating unit is further configured to update to optimize a model indicating a relationship between distribution of an etching amount and a process parameter, which is a parameter of determining a discharge time, a discharge position, and a moving speed of each of the first nozzle and the second nozzle, a parameter of the model.

3. An etching control method performed by an etching control device, the etching control method comprising:

updating, to optimize a model indicating a relationship between distribution of an etching amount within a surface of a substrate and a process parameter, which is a parameter of controlling operations of multiple nozzles configured to etch the substrate, a parameter of the model;

calculating, by using the model whose parameter has been updated in the updating of the parameter of the model, the process parameter corresponding to distribution of a designated etching amount;

updating a process recipe defining operations of the multiple nozzles based on the calculated process parameter; and controlling the operations of the multiple nozzles by using the process parameter, wherein the multiple nozzles include a first nozzle configured to discharge a rinse on the substrate being rotated, and a second nozzle configured to discharge a chemical liquid to etch the substrate being rotated, wherein, in the controlling of the operations of the multiple nozzles, the discharge of the first processing liquid from the first nozzle and the discharge of the second processing liquid from the second nozzle are simultaneously controlled during an etching process, wherein the controlling of the operations of the multiple nozzles includes controlling the operations of the multiple nozzles according to the updated process recipe, wherein the model is a neural network, and the updating includes updating parameters of the neural network by using an error back-propagation method based on training data including an etching amount distribution and corresponding process parameters.

4. An etching control system comprising:

a measuring device configured to measure distribution of an etching amount of a substrate; and an etching control device, wherein the etching control device comprises:

a parameter updating unit configured to update, to optimize a model indicating a relationship between the distribution of the etching amount within a surface of the substrate and a process parameter, which is a parameter of controlling operations of multiple nozzles configured to etch the substrate, a parameter of the model;

a calculator configured to calculate, by using the model whose parameter has been updated by the parameter updating unit, the process parameter corresponding to distribution of a designated etching amount measured by the measuring device; and an operation controller configured to control the operations of the multiple nozzles by using the process parameter;

a recipe updating unit configured to update a process recipe defining operations of the multiple nozzles based on the process parameter calculated by the calculator;

wherein the multiple nozzles include a first nozzle configured to discharge a rinse on the substrate being rotated, and a second nozzle configured to discharge a chemical liquid to etch the substrate being rotated, and wherein the operation controller is further configured to simultaneously control the discharge of the rinse from the first nozzle and the discharge of the chemical liquid from the second nozzle during an etching process, wherein the operation controller is further configured to control the operations of the multiple nozzles according to the process recipe updated based on the process parameter, wherein the model is a neural network, and the parameter updating unit is further configured to update parameters of the neural network by using an error back-propagation method based on training data including an etching amount distribution and corresponding process parameters.

* * * * *